(12) United States Patent
Brodsky et al.

(10) Patent No.: US 9,040,399 B2
(45) Date of Patent: May 26, 2015

(54) THRESHOLD VOLTAGE ADJUSTMENT FOR THIN BODY MOSFETS

(75) Inventors: MaryJane Brodsky, Salt Point, NY (US); Ming Cai, Hopewell Junction, NY (US); Dechao Guo, Fishkill, NY (US); William K. Henson, Beacon, NY (US); Shreesh Narasimha, Beacon, NY (US); Yue Liang, Fishkill, NY (US); Liyang Song, Wappingers Falls, NY (US); Yanfeng Wang, Fishkill, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 13/282,619

(22) Filed: Oct. 27, 2011

(65) Prior Publication Data

US 2013/0105894 A1  May 2, 2013

(51) Int. Cl.
*H01L 21/425* (2006.01)
*H01L 29/66* (2006.01)

(52) U.S. Cl.
CPC ................................ *H01L 29/66803* (2013.01)

(58) Field of Classification Search
USPC .......... 438/525, 527, 528, 149; 257/412, 442, 257/E21.618, E21.633
See application file for complete search history.

(56) References Cited

U.S. PATENT DOCUMENTS

| | | | |
|---|---|---|---|
| 5,683,934 A | 11/1997 | Candelaria | |
| 6,111,296 A | 8/2000 | Yamazaki et al. | |
| 6,455,385 B1 * | 9/2002 | Alvis et al. | 438/301 |
| 6,800,910 B2 | 10/2004 | Lin et al. | |
| 6,977,413 B2 | 12/2005 | Hofmann et al. | |
| 7,186,662 B2 | 3/2007 | Chen et al. | |
| 7,199,430 B2 * | 4/2007 | Babcock et al. | 257/368 |
| 7,202,517 B2 * | 4/2007 | Dixit et al. | 257/287 |
| 7,411,252 B2 | 8/2008 | Anderson et al. | |
| 7,659,158 B2 | 2/2010 | Ma et al. | |
| 7,659,213 B2 * | 2/2010 | Wei et al. | 438/766 |
| 7,736,983 B2 * | 6/2010 | Kohli et al. | 438/303 |
| 7,910,446 B2 | 3/2011 | Ma et al. | |
| 7,915,681 B2 | 3/2011 | Berthold et al. | |
| 8,039,376 B2 * | 10/2011 | Clark et al. | 438/525 |

(Continued)

FOREIGN PATENT DOCUMENTS

WO  20110087571 A1  7/2011

OTHER PUBLICATIONS

Horstmann et al., "Advanced SOI CMOS Transistor Technologies for High-Performance Microprocessor Applications", IEEE 2009 Custom Integrated Circuits Conference (CICC), pp. 149-152.

Kusunoki et al., "TCAD Analysis for Channel Profile Engineering with Carbon Doped Si (Si:C) Layer for Post 32-nm Node Bulk Planar nMOSFETs", Solid State Device Research Conference, 2008, ESSRDERC 2008, pp. 178-181, Nov. 18, 2008.

(Continued)

*Primary Examiner* — Bradley K Smith
*Assistant Examiner* — David Goodwin
(74) *Attorney, Agent, or Firm* — Harrington & Smith

(57) ABSTRACT

A structure includes a substrate; a transistor disposed over the substrate, the transistor comprising a fin comprised of Silicon that is implanted with Carbon; and a gate dielectric layer and gate metal layer overlying a portion of the fin that defines a channel of the transistor. In the structure a concentration of Carbon within the fin is selected to establish a desired voltage threshold of the transistor. Methods to fabricate a FinFET transistor are also disclosed. Also disclosed is a planar transistor having a Carbon-implanted well where the concentration of the Carbon within the well is selected to establish a desired voltage threshold of the transistor.

5 Claims, 11 Drawing Sheets

(56) References Cited

U.S. PATENT DOCUMENTS

| | | |
|---|---|---|
| 8,313,999 B2 | 11/2012 | Cappellani et al. |
| 2005/0087811 A1* | 4/2005 | Liao et al. .................... 257/368 |
| 2006/0068556 A1 | 3/2006 | Noda |
| 2007/0077739 A1 | 4/2007 | Weber et al. |
| 2008/0111185 A1 | 5/2008 | Cheng |
| 2008/0308850 A1 | 12/2008 | Berthold et al. |
| 2009/0011581 A1 | 1/2009 | Weber et al. |
| 2010/0252866 A1 | 10/2010 | Peidous et al. |
| 2011/0147842 A1* | 6/2011 | Cappellani et al. ........... 257/365 |
| 2011/0151652 A1 | 6/2011 | Sssaki et al. |
| 2012/0049293 A1* | 3/2012 | Scheiper et al. .............. 257/392 |

OTHER PUBLICATIONS

Liow et al., "Strained n-Channel FinFETs Featuring In Situ Doped Silicon-Carbon (Si 1-yCy) Source and Drain Stressors with High Carbon Content", IEEE Transactions on Electronic Devices, vol. 55, No. 9, pp. 2475-2483, Sep. 2008.

Ban et al., "Suppression of Oxidation-Enhanced Boron Diffusion in Silicon by Carbon Implantation and Characterization of MOSFET's with Carbon-Implanted Channels", IEEE Transactions on Electron Devices, vol. 44, No. 9, Sep. 1997.

International Search Report for corresponding patent application No. PCT/US12/62048 mailed Mar. 8, 2013.

* cited by examiner

RTA

US 9,040,399 B2

THRESHOLD VOLTAGE ADJUSTMENT FOR THIN BODY MOSFETS

TECHNICAL FIELD

The exemplary embodiments of this invention relate generally to semiconductor devices, transistors, field effect transistors (FETs), FinFETs and multi-gate FETs in general, and further relate to the implanting of Carbon (C) ions into semiconductor devices.

BACKGROUND

It is desirable to achieve a low threshold voltage (Vt) for transistors that operate with a scaled (reduced) value of Vdd. In thin body transistors, such as those known for example as FinFETs and multi-gate, e.g., tri-gate FETS, due to the limited volume of the substrate that is available conventional dopant approaches to adjusting the threshold voltage are not effective to provide, on the same substrate, transistors with different threshold voltages.

SUMMARY

In a first aspect thereof the exemplary embodiments of this invention provide a structure that comprises a substrate; a transistor disposed over the substrate, the transistor comprising a fin comprised of Silicon that is implanted with Carbon; and a gate dielectric layer and gate metal layer overlying a portion of the fin that defines a channel of the transistor. In the structure a concentration of Carbon within the fin is selected to establish a desired voltage threshold of the transistor.

In another aspect thereof the exemplary embodiments of this invention provide a method to fabricate transistor devices. The method comprises providing a Silicon layer having a layer of screen oxide formed on a top surface; applying a first masking layer so as to leave uncovered a first portion of the screen oxide layer; implanting Carbon into the Silicon layer through the uncovered first portion of the screen oxide layer to form a first Carbon-implanted volume of the Silicon layer that has a first Carbon concentration; removing the first masking layer; applying a second masking layer so as to leave uncovered a second portion of the screen oxide layer; implanting Carbon into the Silicon layer through the uncovered second portion of the screen oxide layer to form a second Carbon-implanted volume of the Silicon layer that has a second Carbon concentration that differs from the first Carbon concentration; removing the second masking layer; and processing the Silicon layer so as to form a first FinFET device having a channel that contains the first volume of the Silicon layer and a second FinFET device having a channel that contains the second volume of the Silicon layer. In this method the first FinFET device has a first voltage threshold and the second FinFET device has a second voltage threshold that differs from the first voltage threshold by an amount related to a difference between the first Carbon concentration and the second Carbon concentration.

In still another aspect thereof the exemplary embodiments of this invention provide a method to fabricate transistor devices. The method comprises forming a plurality of fins from a Silicon layer; applying a first masking layer to a first fin while leaving a second fin unmasked; implanting Carbon into the unmasked second fin to have a first Carbon concentration; removing the first masking layer; applying a second masking layer to the implanted second fin while leaving the first fin unmasked; implanting Carbon into the unmasked first fin to have a second Carbon concentration; removing the second masking layer; and forming a first FinFET device that comprises a channel within the first fin and a second FinFET device having a channel within the second fin. In this method the first FinFET device has a first voltage threshold and the second FinFET device has a second voltage threshold that differs from the first voltage threshold by an amount related to a difference between the first Carbon concentration and the second Carbon concentration.

In still another aspect thereof the exemplary embodiments of this invention provide a method to fabricate a transistor device. The method comprises performing a well implant into a surface of a Silicon layer to form an implanted well; annealing the implanted well; and implanting Carbon into the annealed well, where the Carbon is implanted prior to formation of an interfacial layer upon the surface of the Silicon layer. In this method a resulting transistor device has a voltage threshold that is reduced, as compared to a non-Carbon implanted well, by an amount that is determined at least by the Carbon concentration in the implanted well.

BRIEF DESCRIPTION OF THE SEVERAL VIEWS OF THE DRAWINGS

FIG. 1A is an enlarged cross-sectional view, not drawn to scale, of a portion of a starting semiconductor structure that includes a substrate, a buried oxide (BOX) layer, an overlying layer of Silicon (SOI) and a hardmask embodied as a screen oxide layer;

FIG. 1B shows a result of selectively applying a photoresist mask to the surface of the screen oxide layer so as to define at least one area (corresponding to at least one volume in the underlying SOI to be implanted with Carbon at a first implant density;

FIG. 1C shows that the photoresist mask regions are removed after the first Carbon implant;

FIG. 1D shows a result of selectively reapplying the photoresist mask to the surface of the screen oxide layer so as to define an area (and at least one corresponding volume in the underlying SOI) to be implanted with Carbon at a second implant density;

FIG. 1E shows that the photoresist mask regions are removed after the second Carbon implant.

FIG. 2A shows a hardmask layer formed on a substrate and a polysilicon structure;

FIG. 2B shows silicon nitride (SiN) structures are formed along the sides of the polysilicon structure;

FIG. 2C shows a result of etching to form fin structures;

FIG. 2D shows a result of additional etching and gate stack and SiN layer formation perpendicular to the fin structures;

FIG. 2E shows a result of removal of portions of the hardmask layer and the SiN layer, and formation of SiN spacers along the gate stack;

FIG. 2F shows an epitaxial silicon (Epi Si) layer deposited over the fin structures;

FIG. 2G illustrates a cross sectional view of an angled ion implant procedure that forms source and drain regions; and FIG. 2H shows a silicide layer formed on the Epi Si layer and over the gate stack.

FIG. 6A shows a SOI layer having an overlying layer of pad oxide;

FIG. 6B shows a conventional well implant into the SOI layer;

FIG. 6C shows a well implant anneal;

FIG. 6D shows application of a hardmask and a thermal oxidation process;

FIGS. 6E and 6F show a result of patterning and hardmask stripping; and

FIG. 6G shows a Carbon implant step that is carried out prior to interfacial layer processing.

DETAILED DESCRIPTION

In accordance with the exemplary embodiments of this invention the threshold voltage of a thin body transistor is selectively adjusted in order to provide on the same substrate transistors with different Vts. During thin body transistor fabrication a Carbon implant is used to adjust the transistor threshold voltages. By introducing Carbon with different doses transistors with different Vt are provided on the same substrate. Described below is an exemplary process flow that uses a method to adjust the threshold voltages.

Figure 1A:
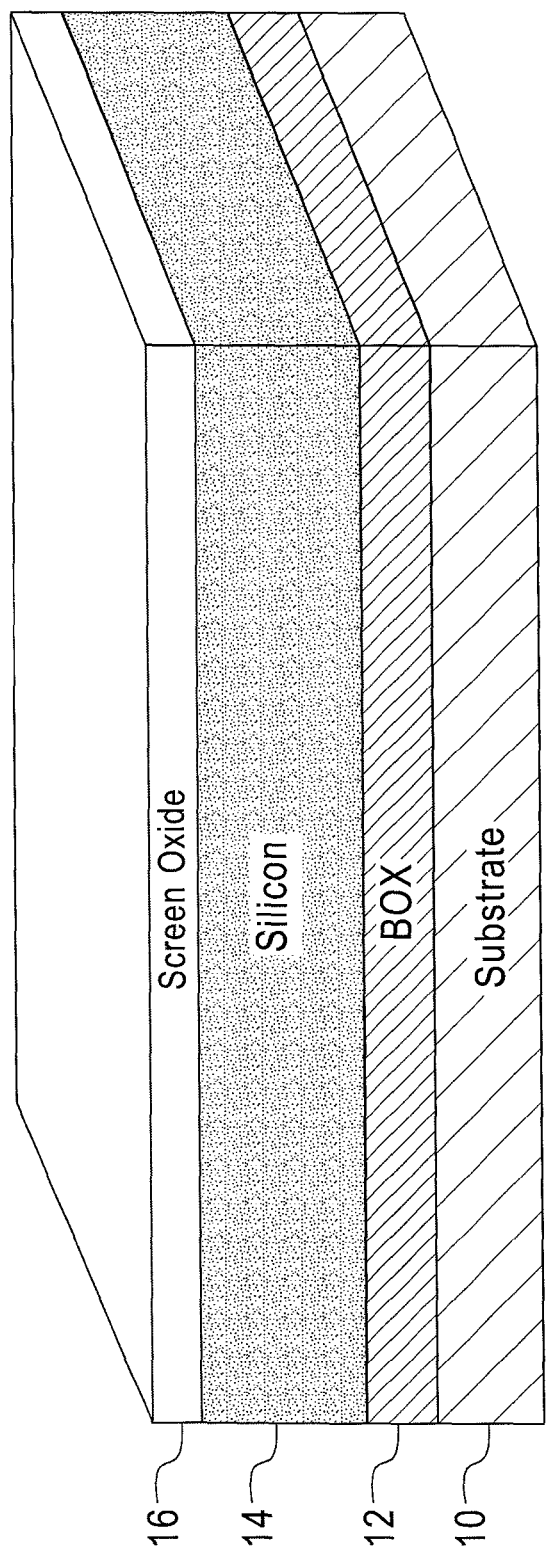
FIGS. 1A-1E, collectively referred to as FIG. 1, show an example of a process flow in accordance with an embodiment of this invention, where

FIG. 1A is an enlarged cross-sectional view, not drawn to scale, of a portion of a semiconductor structure that includes a substrate 10, a buried oxide (BOX) layer 12, an overlying layer of Silicon 14 (silicon-on-insulator SOI) and a hardmask embodied as a screen oxide layer 16. The substrate 10 can have any desired thickness, the BOX layer 12 can also have any desired thickness (e.g., in a range of 50 nm or less to 200 nm or greater), and the Silicon layer 14 may have a thickness in a range of, as one non-limiting example, about 20 nm to about 30 nm The screen oxide layer 16 can be comprised of, for example, $SiO_2$ and can have a thickness of about 2 nm and greater. The screen oxide layer can be formed on top of the Silicon (SOI) layer 14 by using, for example a low temperature deposition process. A purpose of the screen oxide layer 16 is to protect the surface of the Silicon layer 14 during subsequent Carbon ion implanting steps.

Figure 1B:
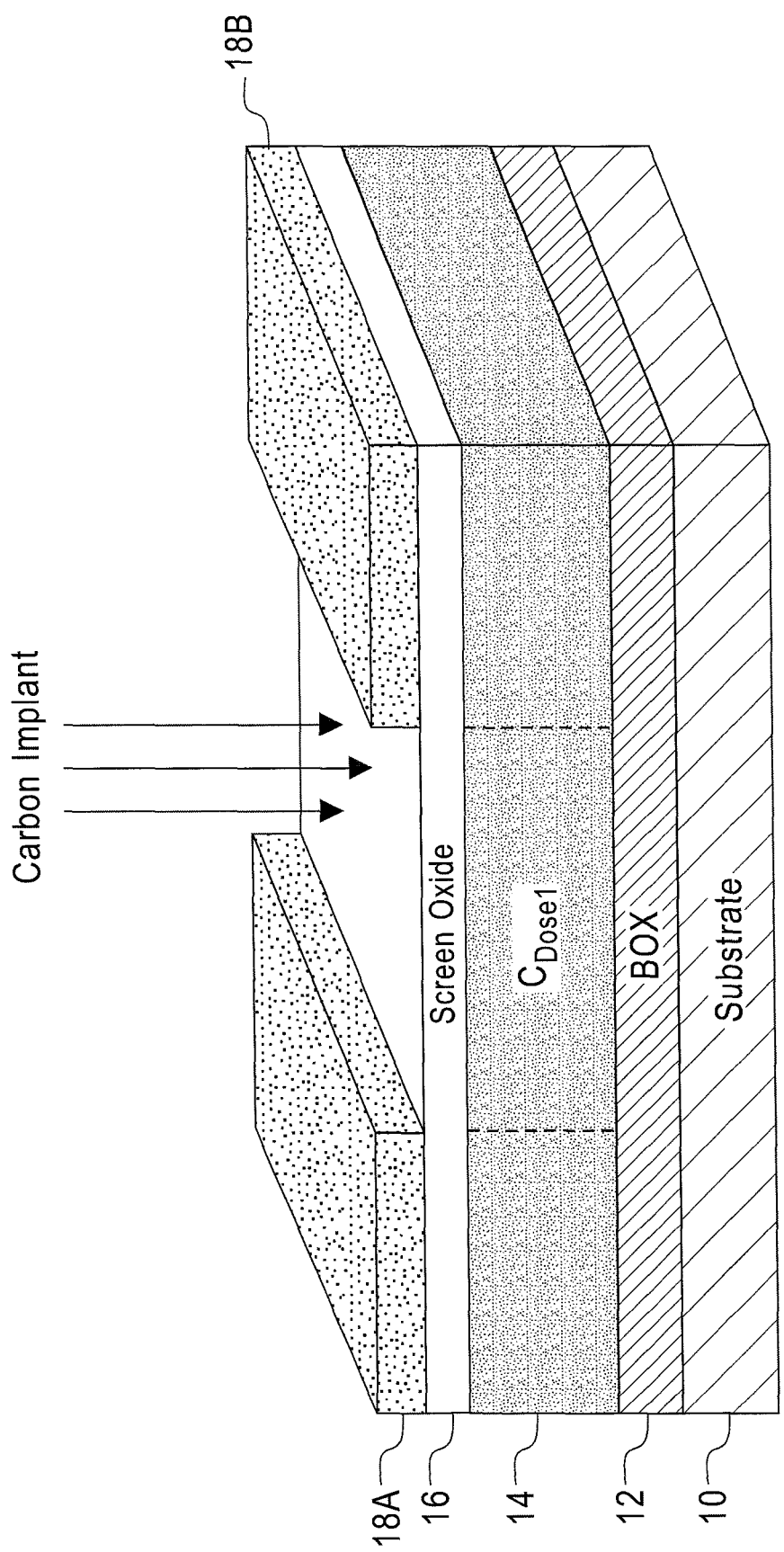

FIG. 1B shows a result of selectively applying a photoresist mask 18 to the surface of the screen oxide layer 16 so as to define at least one area (corresponding to at least one volume in the underlying Silicon layer 14) to be implanted with Carbon at a first implant density. In FIG. 1B the photoresist mask is shown partitioned into two regions 18A, 18B. When the Carbon implant is applied the photoresist regions 18A, 18B block the Carbon ions from reaching the screen oxide layer 16 and the Silicon layer 14.

During the Carbon implant step, and assuming the non-limiting case of a 2 nm thick screen oxide layer 16 and a SOI layer 14 having a thickness in the range of about 20 nm to about 30 nm, multiple Carbon implants can be performed using different energies, such as 8 keV (deep implant) and 4 keV (shallow implant), with a dose in a range of, for example, about $1\times10^{14}$ to about $2\times10^{15}$ atoms/cm$^2$. The goal is to substantially uniformly dope the unmasked volume of the Silicon Layer 14 with Carbon at a desired dopant concentration (indicated as $C_{dose1}$ in FIG. 1B) such that the Carbon concentration is substantially uniform throughout the thickness of the Silicon layer 14. Multiple Carbon implants with different energies can be used to achieve the substantially uniform Carbon doping profile.

Figure 1C:
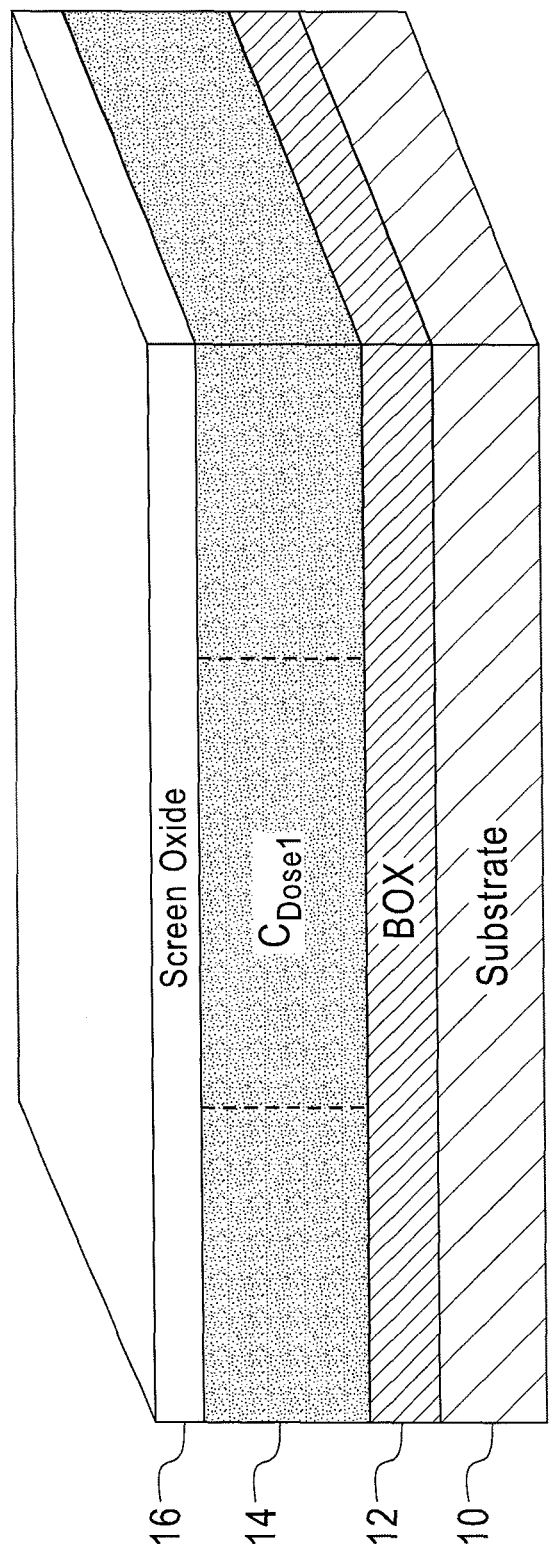

FIG. 1C shows that the photoresist regions 18A and 18B are removed (stripped) using any suitable photoresist removal process.

Figure 1D:
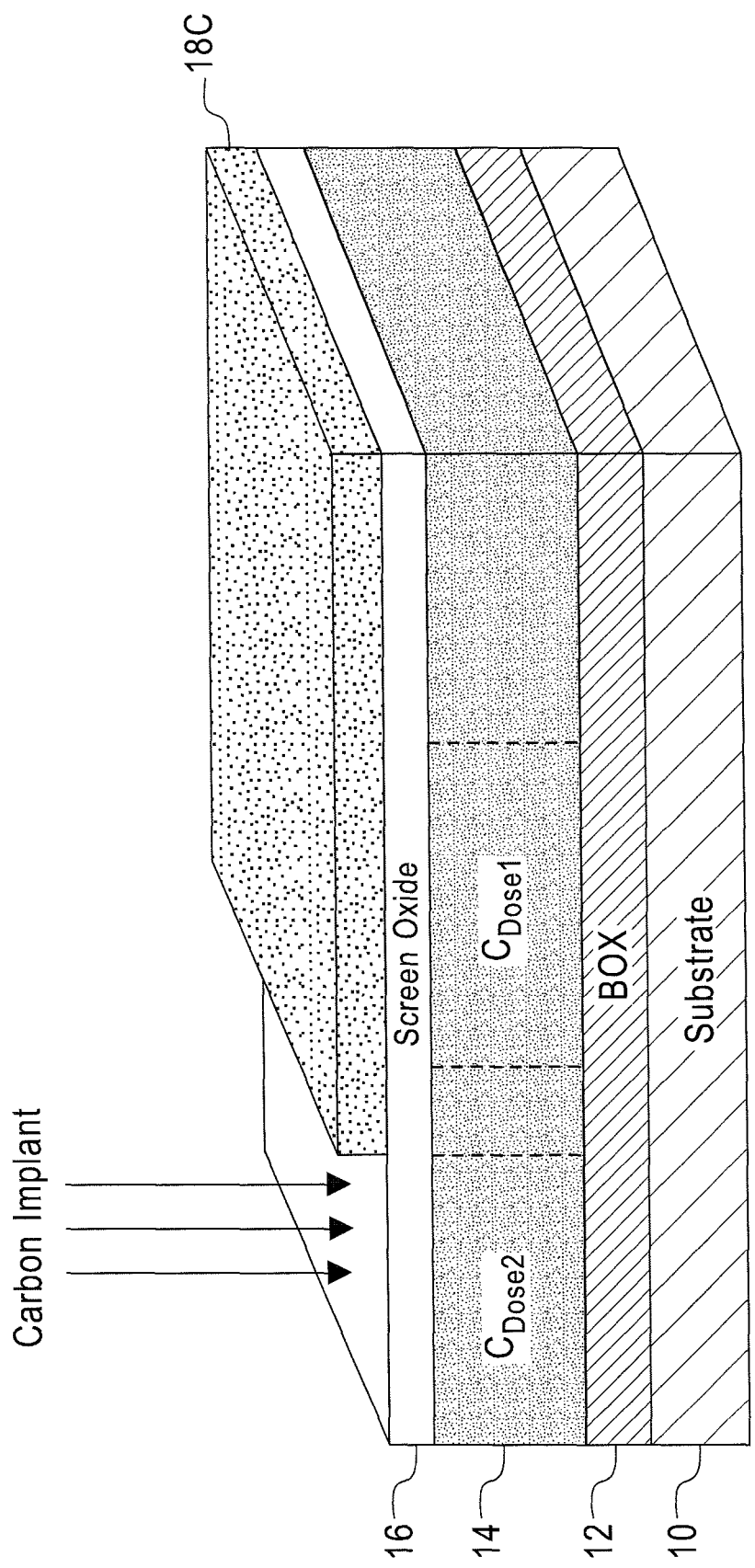

FIG. 1D shows a result of selectively reapplying the photoresist mask 18 to the surface of the screen oxide layer 16 so as to define an area (and at least one corresponding volume in the underlying Silicon layer 14) to be implanted with Carbon at a second implant density. In the example of FIG. 1D the photoresist mask is shown as a single region 18C. When the Carbon implant is applied the photoresist region 18C blocks the Carbon ions from reaching the screen oxide layer 16 and the Silicon layer 14. The goal is once again to substantially uniformly dope the unmasked volume of the Silicon Layer 14 with Carbon at a desired dopant concentration (indicated as $C_{dose2}$ in FIG. 1C) such that the Carbon concentration is substantially uniform throughout the thickness of the Silicon layer 14. Multiple Carbon implants with different energies can be used to achieve the substantially uniform Carbon doping profile. It can be assumed that $C_{dose1}$ and $C_{dose2}$ are different so that resulting FETs (FinFETs in this case) that are subsequently formed from the Silicon layer 14 have different values of Vt.

Figure 1E:
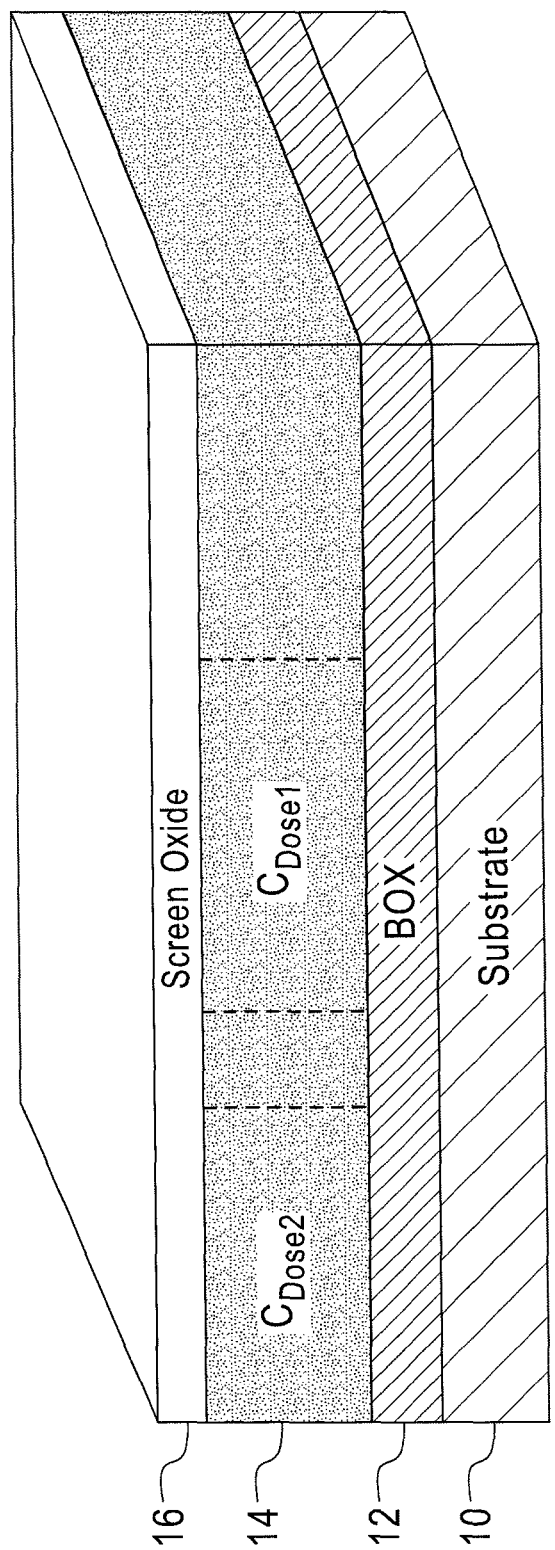

FIG. 1E shows that the photoresist region 1C is removed (stripped) using any suitable photoresist removal process.

The processes depicted in FIGS. 1B-1E can be repeated multiple times to achieve the selective doping of different volumes of the Silicon layer 14 with different concentrations of Carbon. When the Carbon implant steps are completed the screen oxide layer 16 is stripped and conventional FinFET processing can be performed to define a plurality of FinFETs in the Silicon layer 14, where different FinFETs contain different Carbon concentrations for producing FinFETs with different values of Vt.

FIGS. 2A-2H provide an overview of but one exemplary and non-limiting technique to fabricate a FinFET, as described with respect to an embodiment shown in commonly assigned US Patent Application Publication US 2011/0065244 A1, "Asymmetric FINFET Device with Improved Parasitic Resistance and Capacitance", Josephine B. Chang, Leland Chang, Chung-Hsun Lin and Jeffery W. Sleight.

Figure 2A:
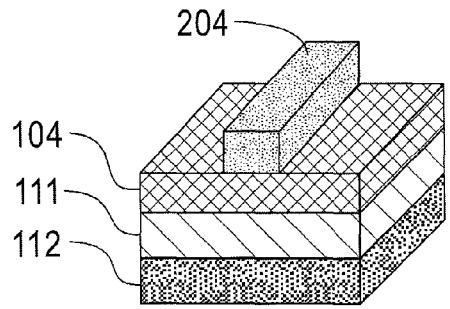
FIGS. 2A-2H, collectively referred to as FIG. 2, illustrate another exemplary method to fabricate a FinFET device, where
Figure 2B:
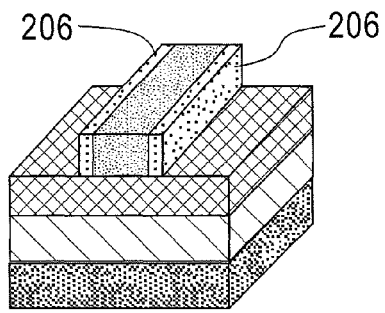
Figure 2C:
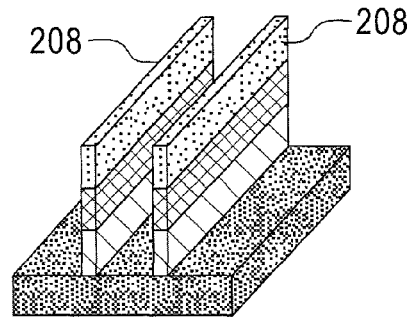
Figure 2D:
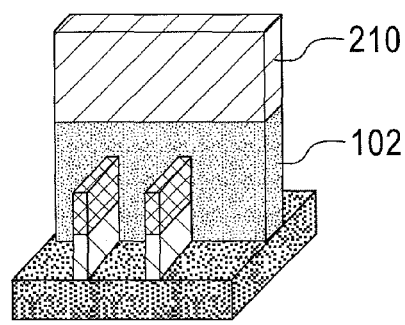
Figure 2E:
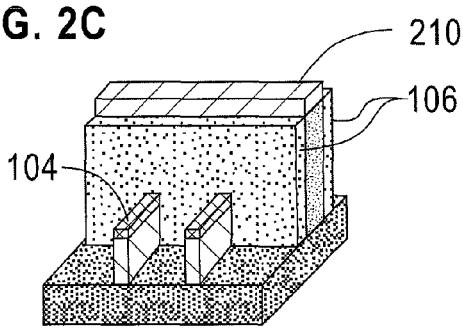
Figure 2F:
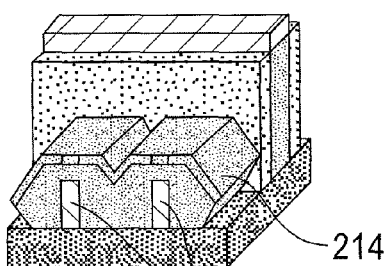
Figure 2G:
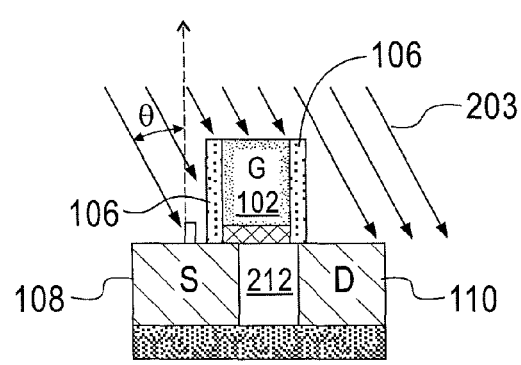
Figure 2H:
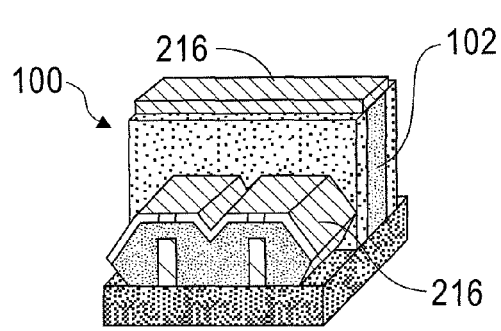

Referring to FIG. 2A, a silicon dioxide ($SiO_2$) (or Silicon Nitride (SiN)) hardmask layer 104 is formed on a substrate. In the illustrated embodiment the substrate can be a silicon-on-insulator (SOI) layer 111 that corresponds to the selectively Carbon-doped Silicon layer 14 depicted in FIGS. 1A-1E. A polysilicon structure 204 is formed on the hardmask layer 104 by deposition and etching processes. Referring to FIG. 2B, silicon nitride (SiN) structures 206 are formed along the sides of the polysilicon structure 204 using deposition and etching processes. In FIG. 2C, the polysilicon structure 204 and portions of the hardmask layer 104 and the SOI layer 111 are etched to form fin structures 208. The illustrated two fin structures 208 are exemplary, as more or less than two fin structures can be formed. In FIG. 2D, the SiN structures 206 are etched, and a gate stack portion 102 and a SiN layer 210 is formed perpendicular to the fin structures 208. Referring to FIG. 2E, portions of the hardmask layer 104 and the SiN layer 210 are removed, and SiN spacers 106 are formed along the gate stack portion 102. In FIG. 2F an epitaxial silicon (Epi Si) layer 214 is deposited over the remaining fin structures 205 for merging the fin structures. FIG. 2G illustrates a cross sectional view an ion implant that forms the source 108 and drain 110 regions in the SOI layer 111. In the illustrated non-limiting embodiment the ions 203 are implanted at an angle (theta) from a line perpendicular to the source region 108. The gate stack portion 102 and the spacers 106 partially block some of the ions 203 from being deposited at a great concentration in the portion 212 of the SOI layer 111, and the implant at the oblique angle (theta) results in an overlapped source region 108 and an offset drain region 110. The implant angle may range from 0-90 degrees, and any additional ranges between 0-90 degrees. An exemplary implant angle of 20-30 degrees is shown in the illustrated embodiments. Referring to FIG. 2H, a silicide layer 216, is formed on the Epi Si layer 214 and over the gate stack portion 102.

Figure 3:
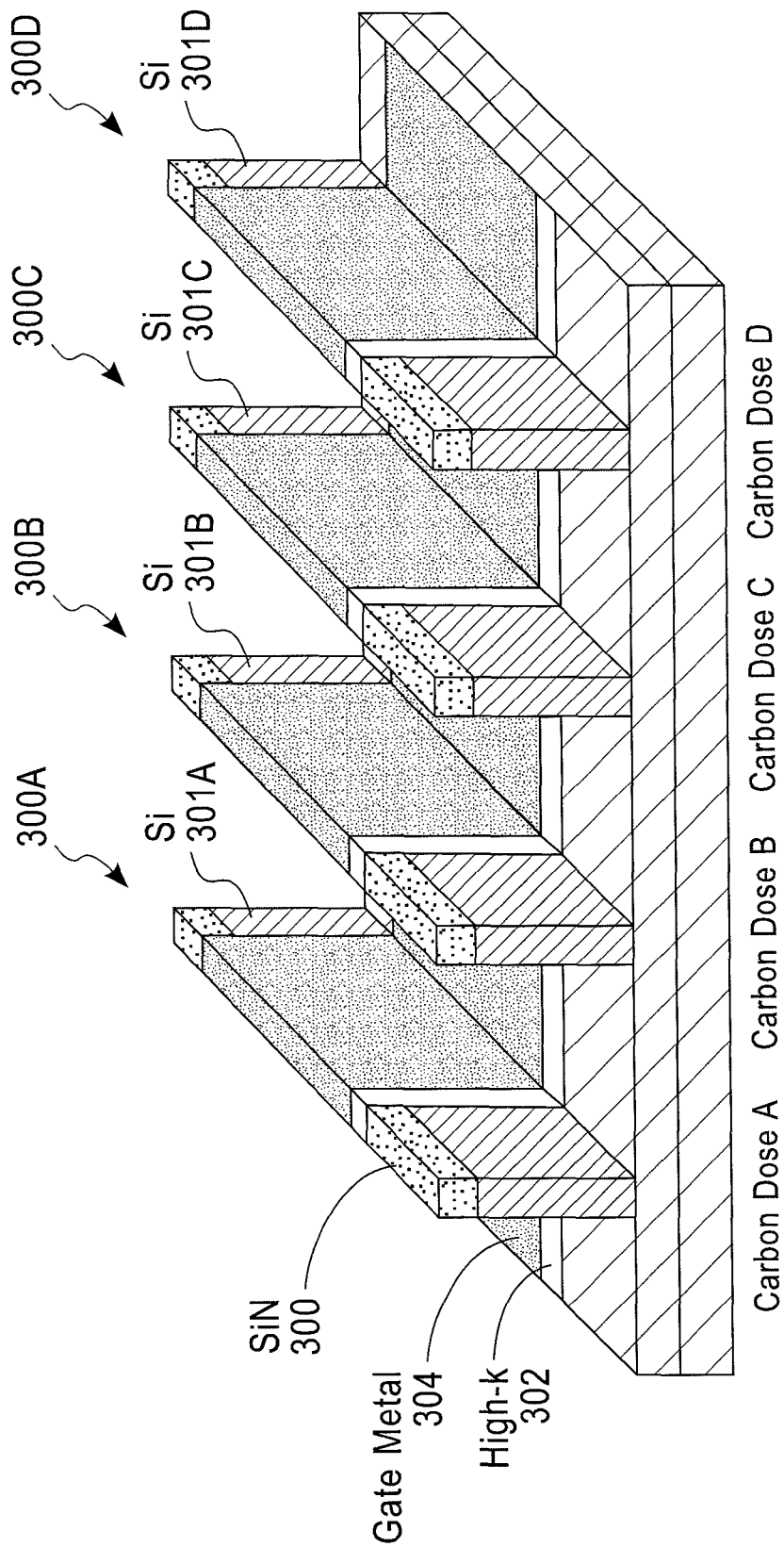
FIG. 3 is an enlarged elevation view (not to scale) that schematically shows a non-limiting example of a plurality of FinFETs where, in accordance with the exemplary embodiments of this invention, each of the fins has a different carbon dose (dose A, dose B, dose C, dose D) and thus each exhibits a different value of Vt.

FIG. 3 schematically shows a non-limiting example of a plurality of FinFETs 300A, 300B, 300C and 300D composed of fins 301A, 301B, 301C and 301D, respectively, that have a common gate insulator layer 302 composed of, for example, high dielectric constant (high-k) material and common gate metallization 304. In FIG. 3 the thickness of the gate metal layer 304 is not drawn to scale. In accordance with the exemplary embodiments of this invention each of the fins 301 has a different carbon dose (dose A, dose B, dose C, dose D) and thus each exhibits a different value of Vt. The different Carbon doses can be achieved by using the process flow shown in FIGS. 1A-1E, that is, by selectively masking different regions of the Silicon layer 14 prior to implanting Carbon. During the FinFET processing (e.g., as shown in FIGS. 2A-2H) the differently Carbon doped Silicon regions are incorporated into different ones of the fins 301 and thus into the resulting different ones of the FinFETs 300. As is shown, on each Silicon fin 301 there is a hardmask layer 303, such as one composed of SiN.

As non-limiting examples each fin 301 can have a width of about 10 nm or less and a height in a range of about 20 nm to about 30 nm (i.e., a height that is about equal to the thickness of the Silicon layer 14). The high dielectric constant (high-k) dielectric layer 302 is formed over the fins 301. The high-k dielectric layer 302 comprises a high dielectric constant (high-k) material comprising a dielectric metal oxide and having a dielectric constant that is greater than the dielectric constant of silicon nitride of 7.5. The high-k dielectric layer 302 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 302 may be from 1 nm to 10 nm, and more preferably from about 1.5 nm to about 3 nm. The high-k dielectric layer 30 can have an effective oxide thickness (EOT) on the order of, or less than, about 1 nm. The gate metal 304 can be deposited directly on the top surface of the high-k dielectric layer 302 by, for example, chemical vapor deposition (CVD), physical vapor deposition (PVD), or atomic layer deposition (ALD). As non-limiting examples the gate metal 304 can include a metal system selected from TiN, TiC, TaN, TaC, TaSiN, HfN, W, Al and Ru.

It has been found that for a range of Carbon implant doses that result in Carbon concentrations from about $2 \times 10^{14}$ to about $5 \times 10^{15}$ atoms/$cm^3$ that the Vt can be reduced by as much as 200 mV as compared to Silicon that has not been implanted with Carbon. It has also been found that the drain induced barrier lowering (DIBL) remains relatively constant for a range of gate lengths from about 0.025 to about 0.035 micrometers, indicating that the Carbon implant does not result in any appreciable short channel effect (SCE) degradation.

Figure 4:
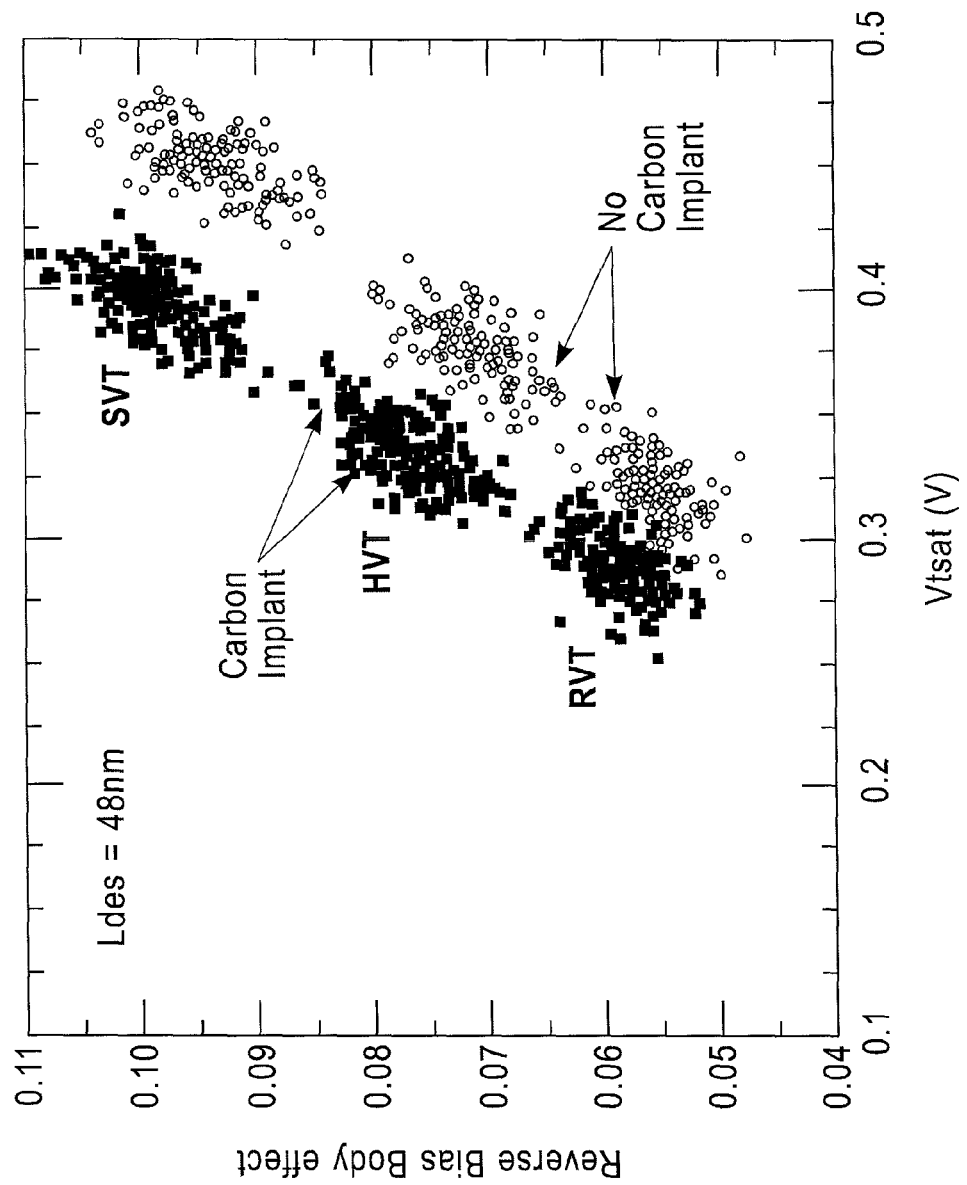
FIG. 4 is a plot of reverse bias body effect versus Vt saturation (Vtsat), where the solid circles correspond to Carbon doping and the empty circles correspond to no Carbon doping.

FIG. 4 plots reverse bias body effect versus Vt saturation (Vtsat), where the solid circles correspond to Carbon doping and the empty circles correspond to no Carbon doping. This example assumes an nFET having a channel doped with Boron ($10^{18}$ atoms/$cm^3$) for regular Vt (RVT), high Vt (HVT) and super high Vt (SVT) cases. Note the significant reduction in Vt exhibited by the Carbon-doped devices as compared to the devices that are not doped with Carbon.

In FIG. 4 Carbon is implanted for Vt reduction in partially depleted SOI. If the Vt adjustment is through the workfunction, the body effect is kept unchanged. If the Vt adjustment is through the well dopant, the body effect should be increased. By introducing Carbon, the Vt is adjusted but the body effect does not change. Therefore it can be concluded that the Vt shift achieved by the Carbon doping is a result of the modulation of the effective workfunction.

Figure 5:
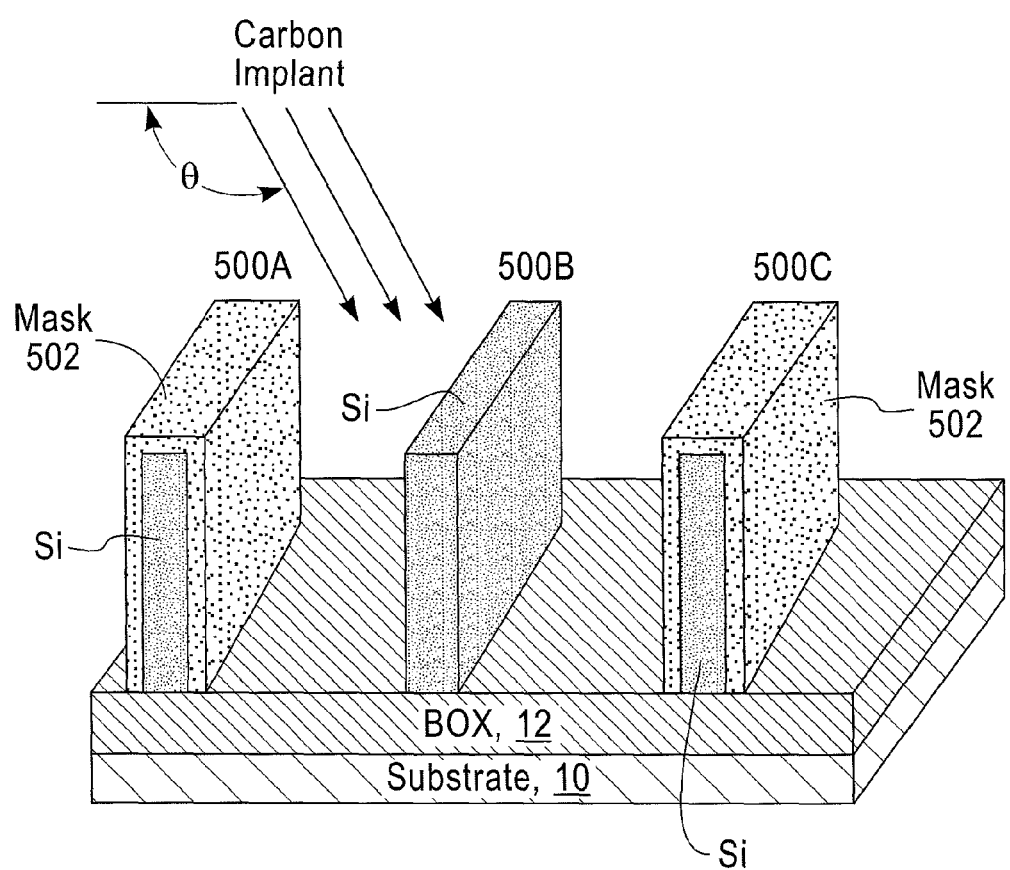
FIG. 5 shows another embodiment of a process in accordance with the exemplary embodiments of this invention where Carbon is implanted into the fins after the fins are defined.

FIG. 5 shows another embodiment of a process in accordance with the exemplary embodiments of this invention. FIG. 5 differs from FIG. 1 in that the Carbon is implanted after the fins are defined and prior to application of the high-k gate insulator and gate metal layers. FIG. 5 shows an exemplary case of three adjacent fins 500A, 500B and 500C, where the middle-most fin 500B is being implanted with Carbon and the outer-most fins 500A and 500C have been covered by a mask 502 (e.g., screen oxide $SiO_2$). The implant angle θ is predetermined based on fin height and spacing to avoid shadowing effects so that the entire volume of the fin 500B is substantially equally doped with Carbon. Either the substrate or the ion source can be rotated so that both major vertical surfaces of the fin 500B can be implanted with Carbon. After implanting the first fin (500B in this case) the mask 502 is stripped and selectively reapplied as needed to implant the next fin or fins. The Carbon implant density is adjusted as needed to achieve the desired value of Vt for the resulting FinFET.

In the embodiments of FIGS. 1 and 5 it is not necessary that all fins contain implanted Carbon, as in some transistor devices it may be desired to provide a value of Vt that is not reduced.

The exemplary embodiments of this invention have been described thus far in the context of the fabrication of FinFETs and multi-gate transistors. However, the embodiments of this invention also encompass planar transistor devices, such as those fabricated using partially depleted SOI (PDSOI).

As was stated previously, it is desirable to achieve low threshold voltages for transistors with scaled Vdd. One approach to lower high-k metal gate (HKMG) nFET Vt is through rare metal diffusion towards the bottom interfacial layer of $HfO_2$, e.g., by the use of La or Lu. However, this approach has a disadvantage of degrading electron mobility. The exemplary embodiments of this invention also provide a technique to reduce HKMG nFET Vt, without degrading electron mobility, by the use of a Carbon implant.

FIG. 6 shows preliminary processing steps for forming a HKMG nFET. A HKMG pFET can be formed as well. FIG. 6A shows a SOI layer 600 having an overlying layer of pad oxide 602. FIG. 6B shows a conventional well implant into the SOI layer 600. FIG. 6C shows a well implant anneal (rapid thermal anneal (RTA)) which can be carried out at about 1000° C. for several seconds (e.g., 5 seconds). FIG. 6D shows application of a hardmask 604 and a thermal oxidation process. FIGS. 6E and 6F show a result of patterning 606 and hardmask stripping. FIG. 6G shows a Carbon implant step (masks can be applied if needed). The Carbon implant can be a low energy implant as it is not necessary to implant the Carbon through the entire thickness of the SOI layer 600. A subsequent step involves interfacial layer processing to apply the IL where gate stacks will subsequently be formed.

Figure 6A:
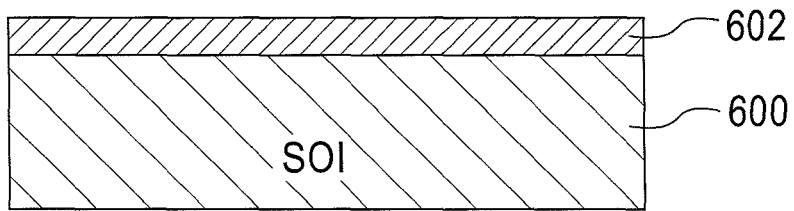
FIGS. 6A-6G, collectively referred to as FIG. 6, depict preliminary processing steps for forming a HKMG nFET in accordance with an embodiments of this invention, where.
Figure 6B:
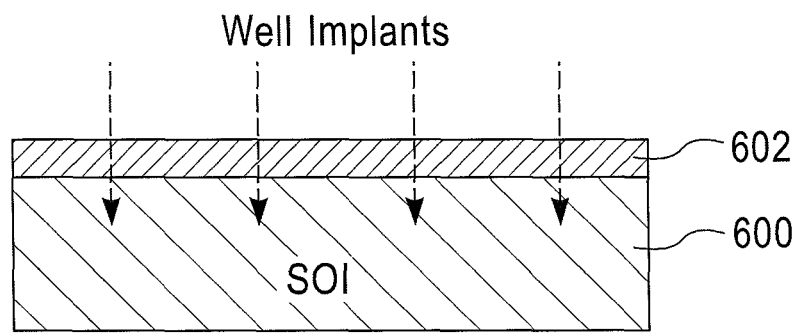
Figure 6C:
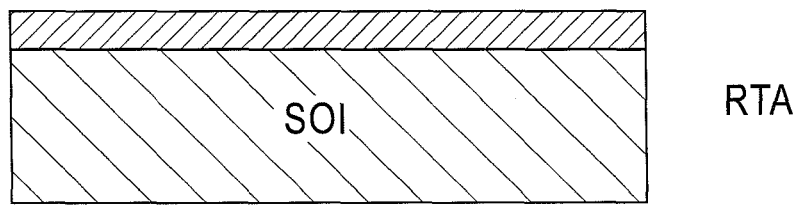
Figure 6D:
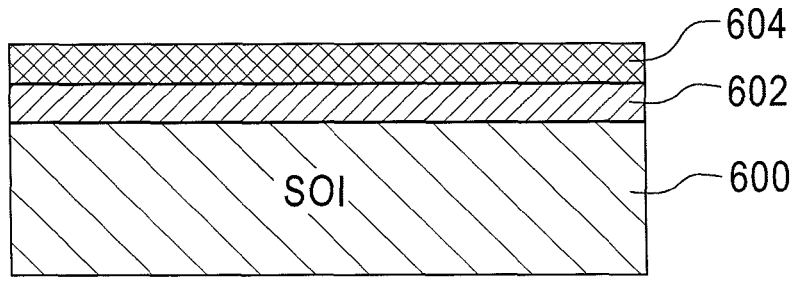
Figure 6E:
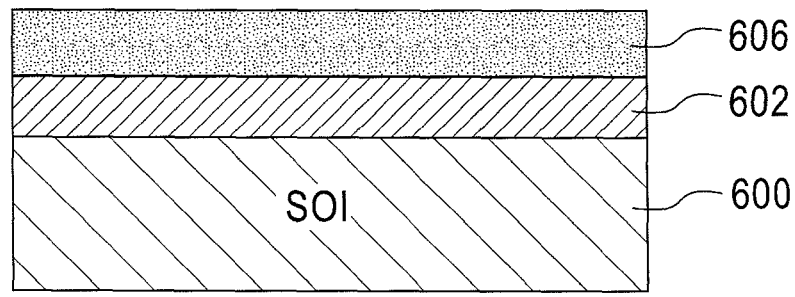
Figure 6F:
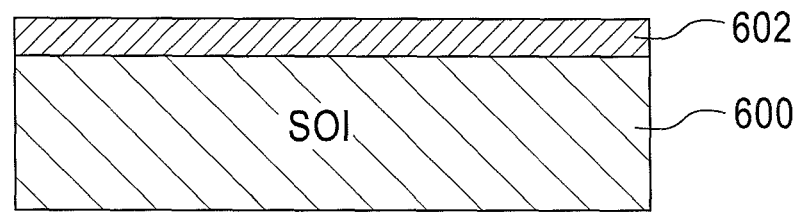
Figure 6G:
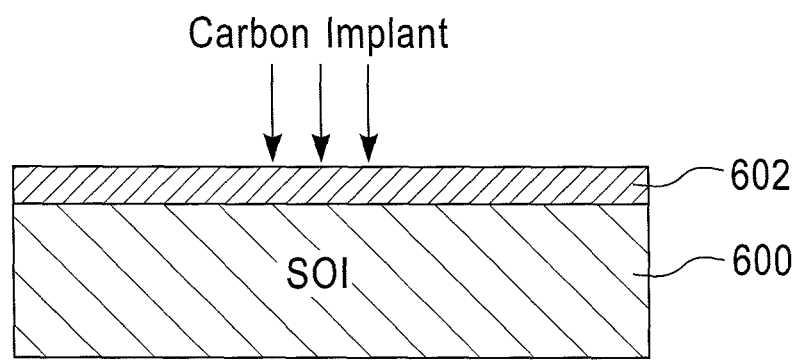

In accordance with the invention the Carbon implant step of FIG. 6G is performed after the well implant (FIG. 6B) and after the well RTA (FIG. 6C) and prior to interfacial layer processing. The Carbon implant is performed to adjust the Vt of the subsequently formed HKMG transistor to a desired point, in a manner similar to that described about for the FinFET embodiments.

The exemplary embodiments of this invention can be used to fabricate integrated circuit chips that can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant art in view of the foregoing description, when read in conjunction with the accompanying drawings and the appended claims. As but some examples, the use of other layer thicknesses, layer materials, feature dimensions, process apparatus, implant energies and doses and the like may be used by those skilled in the art. However, all such and similar modifications of the teachings of this invention will still fall within the scope of this invention.

What is claimed is:

1. A method to fabricate transistor devices, comprising:
   providing a Silicon layer having a layer of screen oxide formed on a top surface;
   applying a first masking layer so as to leave uncovered a first portion of the screen oxide layer;
   implanting Carbon into the Silicon layer through the uncovered first portion of the screen oxide layer to form a first Carbon-implanted volume of the Silicon layer that has a first Carbon concentration;
   removing the first masking layer;
   applying a second masking layer so as to leave uncovered a second portion of the screen oxide layer;
   implanting Carbon into the Silicon layer through the uncovered second portion of the screen oxide layer to form a second Carbon-implanted volume of the Silicon layer that has a second Carbon concentration that differs from the first Carbon concentration;
   removing the second masking layer; and
   processing the Silicon layer so as to form a first FinFET device having a channel that contains the first volume of the Silicon layer and a second FinFET device having a channel that contains the second volume of the Silicon layer, where the first FinFET device has a first voltage threshold and the second FinFET device has a second voltage threshold that differs from the first voltage threshold by an amount related to a difference between the first Carbon concentration and the second Carbon concentration,
   where each step of implanting comprises use of at least two Carbon implant operations each carried out using a different implant energy such that the concentration of Carbon is made substantially uniform throughout the thickness of the layer of Silicon within the implanted volume; and where
   each of the first and the second Carbon concentrations is in a range of about $2 \times 10^{14}$ to about $5 \times 10^{15}$ atoms/cm$^3$ to selectively establish the value of the voltage threshold in each of the first FinFET device and the second FinFET device as a function of the first Carbon concentration and the second Carbon concentration.

2. The method of claim 1, further comprising removing the screen oxide layer prior to the step of processing the Silicon layer.

3. The method of claim 1, where the Silicon layer is a Silicon-on-Insulator (SOI) layer.

4. A method to fabricate transistor devices, comprising:
   forming a plurality of fins from a Silicon layer;
   applying a first masking layer to a first fin while leaving a second fin unmasked;
   implanting Carbon into the unmasked second fin to have a first Carbon concentration;
   removing the first masking layer;
   applying a second masking layer to the implanted second fin while leaving the first fm unmasked;
   implanting Carbon into the unmasked first fin to have a second Carbon concentration;
   removing the second masking layer; and
   forming a first FinFET device that comprises a channel within the first fin and a second FinFET device having a channel within the second fm, where the first FinFET device has a first voltage threshold and the second FinFET device has a second voltage threshold that differs from the first voltage threshold by an amount related to a difference between the first Carbon concentration and the second Carbon concentration, where each step of implanting comprises use of at least two Carbon implant operations performed on each of two major surfaces of the fin such that the concentration of Carbon is made substantially uniform throughout the thickness of the fin; and where where the first and second Carbon concentrations are each in a range of about $2 \times 10^{14}$ to about $5 \times 10^{15}$ atoms/cm$^3$ to selectively establish the value of the voltage threshold in each of the first FinFET device and the second FinFET device as a function of the first Carbon concentration and the second Carbon concentration.

5. The method of claim 4, where the Silicon layer is a Silicon-on-Insulator (SOI) layer.

\* \* \* \* \*